(12) United States Patent
Khalajzadeh et al.

(10) Patent No.: US 12,386,340 B2
(45) Date of Patent: Aug. 12, 2025

(54) SYSTEMS AND METHODS FOR GENERATING POST-POLISHING TOPOGRAPHY FOR ENHANCED WAFER MANUFACTURING

(71) Applicant: GlobalWafers Co., Ltd., Hsinchu (TW)

(72) Inventors: Vahid Khalajzadeh, O'Fallon, MO (US); Sumeet S. Bhagavat, St. Charles, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 693 days.

(21) Appl. No.: 17/652,571

(22) Filed: Feb. 25, 2022

(65) Prior Publication Data

US 2023/0274986 A1    Aug. 31, 2023

(51) Int. Cl.
*G05B 19/418*    (2006.01)
*H01L 21/66*    (2006.01)

(52) U.S. Cl.
CPC ........ *G05B 19/41875* (2013.01); *H01L 22/20* (2013.01)

(58) Field of Classification Search
CPC ........ G05B 19/41875; G05B 19/41885; G05B 2219/2602; G05B 2219/37224; G05B 2219/45031; G05B 2219/45232; H01L 22/20
See application file for complete search history.

(56) References Cited

U.S. PATENT DOCUMENTS

| 7,927,185 B2 | 4/2011 | Vandamme et al. |
| 7,930,058 B2 | 4/2011 | Bhagavat et al. |
| 8,145,342 B2 | 3/2012 | Bhagavat et al. |
| 8,647,985 B2 | 2/2014 | Schwandner et al. |
| 8,712,575 B2 | 4/2014 | Bhagavat et al. |
| 8,801,500 B2 | 8/2014 | Pietsch |
| 9,601,395 B2 | 3/2017 | Bhagavat et al. |
| 2021/0247748 A1 | 8/2021 | Bhagavat |
| 2022/0404317 A1* | 12/2022 | Abreu Calfa ........ G01N 29/043 |

FOREIGN PATENT DOCUMENTS

KR    20220019717 A    2/2022

OTHER PUBLICATIONS

International Search Report and Written Opinion issued by the International Search Authority in PCT/US2023/063117 mailed Jun. 28, 2023, pp. 52.

* cited by examiner

*Primary Examiner* — Walter L Lindsay, Jr.
*Assistant Examiner* — Geoffrey T Evans
(74) *Attorney, Agent, or Firm* — Armstrong Teasdale LLP

(57) ABSTRACT

A computer device is programmed to store a model for converting shape maps to simulate a portion of an assembly line, receive scan data of a first inspection of a product being assembled, generate a shape map from the scan data of the first inspection, execute the model using the shape map as an input to generate a final shape map of the product, compare the final shape map to one or more thresholds, determine if the final shape map exceeds at least one of the one or more thresholds, and if the determination is that the final shape map exceeds at least one of the one or more thresholds, cause the first device to be adjusted.

20 Claims, 14 Drawing Sheets

SYSTEMS AND METHODS FOR GENERATING POST-POLISHING TOPOGRAPHY FOR ENHANCED WAFER MANUFACTURING

FIELD

The field relates generally to enhanced wafer manufacturing and more specifically, to enhanced wafer analysis using nanotopography.

BACKGROUND

Semiconductor wafers, such as silicon wafers, are commonly used as substrates in the production of integrated circuit (IC) chips. Chip manufacturers require wafers that have extremely flat and parallel surfaces to ensure that a maximum number of chips can be fabricated from each wafer. After being sliced from an ingot, wafers typically undergo grinding and polishing processes designed to improve certain surface features, such as flatness and parallelism.

In order to identify and address topology degradation concerns, device and semiconductor material manufacturers consider the nanotopography of the wafer surfaces. For example, Semiconductor Equipment and Materials International (SEMI), a global trade association for the semiconductor industry (SEMI document 3089), defines nanotopography as the deviation of a wafer surface within a spatial wavelength of about 0.2 mm to about 20 mm. This spatial wavelength corresponds very closely to surface features on the nanometer scale for processed semiconductor wafers. Nanotopography measures elevational deviation of one surface of the wafer and does not consider thickness variations of the wafer, as with traditional flatness measurements. Two techniques, light scattering and interferometry, are generally used to measure nanotopography. These techniques use light reflected from a surface of a polished wafer to detect very small surface variations.

In the semiconductor industry, companies are competing to produce high quality silicon wafers with lower costs. Thus, having a highly efficient production process with minimum losses provides a competitive advantage. Production processes like wire saw slicing and grinding result in topography features on the wafer which can lead to topography degradation. Moreover, the typical measurement tools available for measurement after these processes tend to have lot of noise. Post polishing tools cannot be used after these processes as surface roughness is too high. To avoid these features, it is very important to closely monitor post-polishing maps such as: In-plane distortion (IPD), Nano-topography (NT) and post-polishing shape maps at different stages during silicon wafer production. However, most post-polishing maps are only available at the late stages of the production which makes the feedbacking process very inefficient.

In some systems, many wafers may be processed after grinding but before problems are detected in the grinding process. Also, each individual production line and grinder may have particular characteristics, which may vary from device to device. Accordingly, there is a need for a system for analyzing wafers to quickly and efficiently detect potential issues and reduce material losses while increasing efficiency.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

In one aspect, a computer device includes at least one processor (or "the processor) in communication with at least one memory device. The processor is programmed to store, in the at least one memory device, a model for converting shape maps to simulate a portion of an assembly line. The processor is also programmed to receive scan data of a first inspection of a product being assembled. The first inspection is conducted at a first inspection station in the assembly line subsequent to a first device in the assembly line. The processor is further programmed to generate a shape map from the scan data of the first inspection. In addition, the processor is programmed to execute the model using the shape map as an input to generate a final shape map of the product. Moreover, the processor is programmed to compare the final shape map to one or more thresholds. Furthermore, the processor is programmed to determine if the final shape map exceeds at least one of the one or more thresholds. If the determination is that the final shape map exceeds at least one of the one or more thresholds, the processor is programmed to cause the first device to be adjusted.

In another aspect, a method for analyzing an assembly line is performed by a computing device including at least one processor in communication with at least one memory device. The method includes storing, in the at least one memory device, a model for converting shape maps to simulate a portion of an assembly line. The method also includes receiving scan data of a first inspection of a product being assembled. The first inspection is conducted at a first inspection station in the assembly line subsequent to a first device in the assembly line. The method further includes generating a shape map from the scan data of the first inspection. In addition, the method includes executing the model using the shape map as an input to generate a final shape map of the product. Moreover, the method includes comparing the final shape map to one or more thresholds. Furthermore, the method includes determining if the final shape map exceeds at least one of the one or more thresholds. If the determination is that the final shape map exceeds at least one of the one or more thresholds, the method includes causing the first device to be adjusted.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Corresponding reference characters indicate corresponding parts throughout the several views of the drawings.

DETAILED DESCRIPTION

Figure 1:
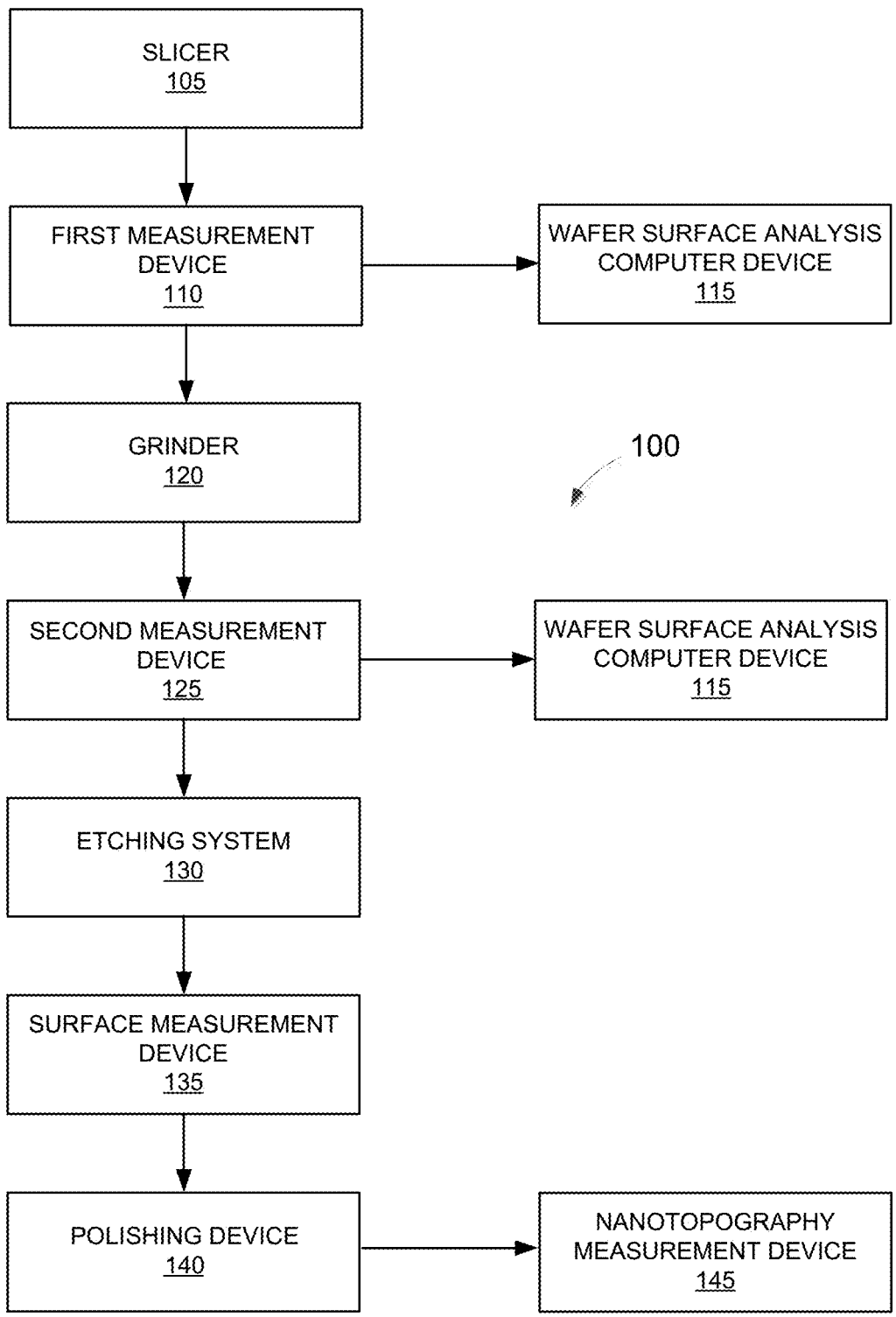
FIG. 1 illustrates a block diagram of a system for processing semiconductor wafers in accordance with an embodiment.

The implementations described relate to systems and methods for analyzing wafer data and, more specifically, to analyzing post grinding surfaces of wafers to predict the post-processing surfaces of the wafers. More specifically, a wafer surface analysis model is executed by a computing device to (1) determine current conditions of a wafer; (2) predict a post-processing state of conditions of the wafer based on the current conditions and the model; and (3) determine if adjustments need to be made to the grinder based on the post-processing state of the wafer and one or more predetermined thresholds. The systems and methods permit nanotopography feedback in less time and with higher accuracy compared to prior processes, allowing adjustments that can be made to improve nanotopography to be recognized and implemented with less lag time for improved quality control and/or wafer yield.

Computer systems such as the wafer surface analysis computer devices and related computer systems include a processor and a memory. However, any processor in a computer device referred to herein may also refer to one or more processors wherein the processor may be in one computing device or a plurality of computing devices acting in parallel. Additionally, any memory in a computer device referred to herein may also refer to one or more memories wherein the memories may be in one computing device or a plurality of computing devices acting in parallel.

A processor may include any programmable system including systems using micro-controllers, reduced instruction set circuits (RISC), application-specific integrated circuits (ASICs), logic circuits, and any other circuit or processor capable of executing the functions described herein. The above examples are example only, and are thus not intended to limit in any way the definition and/or meaning of the term "processor."

The term "database" may refer to either a body of data, a relational database management system (RDBMS), or to both. As used herein, a database may include any collection of data including hierarchical databases, relational databases, flat file databases, object-relational databases, object oriented databases, and any other structured collection of records or data that is stored in a computer system. The above examples are example only, and thus are not intended to limit in any way the definition and/or meaning of the term database. Examples of RDBMS' include, but are not limited to including, Oracle® Database, MySQL, IBM® DB2, Microsoft® SQL Server, Sybase®, and PostgreSQL. However, any database may be used that enables the systems and methods described herein. (Oracle is a registered trademark of Oracle Corporation, Redwood Shores, California; IBM is a registered trademark of International Business Machines Corporation, Armonk, New York; Microsoft is a registered trademark of Microsoft Corporation, Redmond, Washington; and Sybase is a registered trademark of Sybase, Dublin, California.)

A computer program of one embodiment is embodied on a computer-readable medium. In an example, the system is executed on a single computer system, without requiring a connection to a server computer. In a further example embodiment, the system is being run in a Windows® environment (Windows is a registered trademark of Microsoft Corporation, Redmond, Washington). In yet another embodiment, the system is run on a mainframe environment and a UNIX® server environment (UNIX is a registered trademark of X/Open Company Limited located in Reading, Berkshire, United Kingdom). In a further embodiment, the system is run on an iOS® environment (iOS is a registered trademark of Cisco Systems, Inc. located in San Jose, CA). In yet a further embodiment, the system is run on a Mac OS® environment (Mac OS is a registered trademark of Apple Inc. located in Cupertino, CA). In still yet a further embodiment, the system is run on Android® OS (Android is a registered trademark of Google, Inc. of Mountain View, CA). In another embodiment, the system is run on Linux® OS (Linux is a registered trademark of Linus Torvalds of Boston, MA). The application is flexible and designed to run in various different environments without compromising any major functionality. In some embodiments, the system includes multiple components distributed among a plurality of computing devices. One or more components are in the form of computer-executable instructions embodied in a computer-readable medium. The systems and processes are not limited to the specific embodiments described herein. In addition, components of each system and each process can be practiced independently and separately from other components and processes described herein. Each component and process can also be used in combination with other assembly packages and processes.

An element or step recited in the singular and proceeded with the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

The terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are example only, and are thus not limiting as to the types of memory usable for storage of a computer program.

The term "real-time" refers to at least one of the time of occurrence of the associated events, the time of measurement and collection of predetermined data, the time to process the data, and the time of a system response to the events and the environment. These activities and events occur substantially instantaneously.

The systems and processes are not limited to the specific embodiments described herein. In addition, components of each system and each process can be practiced independent and separate from other components and processes described herein. Each component and process also can be used in combination with other assembly packages and processes.

FIG. 1 illustrates a block diagram of a system 100 for processing semiconductor wafers. System 100 starts with the slicer 105 in the process of silicon wafer manufacture. In the example embodiment, the slicer 105 is a wire saw that cuts disks of silicon material.

After the slicer 105 slices the wafer, the wafer is analyzed by a first measurement device 110 that measures data to generate a profile for the wafer. At this point, the wafer is unground, unetched, and unpolished. The first measurement device 110 provides the measurement data from the ground wafer to a wafer surface analysis (WSA) computer device 115. In some embodiments, first measurement device 110 uses a capacitance probe or a laser-based distance sensor to measure the wafers. In particular, the WAS computer device 115 uses post-slicing Shape and GAPI RMS data to generate In-plane distortion (IPD), Nano-topography (NT), and shape distribution maps for silicon wafers. As used herein, GAPI RMS refers to a shape-based matrix that is an index for representing of the smoothness of a wafer substrate.

GAPI RMS can be calculated by the WSA computer device 115. First, the WSA computer device 115 loads the raw measurement data, such as from the first measurement device 110. The raw measurement data includes thickness and lower (or front) profile. The WSA computer device 115 converts the raw data to several diameter line scan profiles. The number of diameter scan profiles could be 2, 4, 8, or more. The WSA computer device 115 calculates the least squares best fitting to the thickness plane. The WSA computer device 115 calculates the raw shape diameter scan profiles by low profile plus half of the thickness-best fitting plane thickness. The WSA computer device 115 smooths the raw shape diameter scan profiles by the moving average with the defined window size. The WSA computer device 115 calculates the ideal shape diameter scan profiles by each raw shape diameter scan profile with one dimensional polynomial fitting. The WSA computer device 115 determines the delta of shape diameter scan profiles equals the raw shape diameter scan profiles minus the ideal shape diameter scan profiles.

The WSA computer device 115 calculates the weighting profiles by delta shape variation and slope changes within the defined moving windows along the diameter direction. The thresholds are also defined for catching high variation and slope changes. The delta shape variation could be standard variation, variance, or range. The slope change means, for example, when the left side slope times the right side slope is negative. GAPI stands for the gap between raw shape and ideal shape, which equals the delta shape diameter times the weighting profile. GAPI RMS is the root means square of GAPI.

The WSA computer device 115 analyzes the measurement data of the wafer to determine the profile of the wafer after slicing. If the determined profile exceeds any quality thresholds, then the WSA computer device 115 may determine that the slicer 105 or other device needs to be adjusted.

The next device in system 100 is the grinder 120, which may be single-sided or double-sided. Simultaneous double side grinding operates on both sides of a wafer at the same time and produces wafers with highly planarized surfaces. These grinders 120 use a wafer-clamping device to hold the semiconductor wafer during grinding. The clamping device typically comprises a pair of hydrostatic pads and a pair of grinding wheels. The pads and wheels are oriented in opposed relation to hold the wafer therebetween in a vertical orientation. The hydrostatic pads beneficially produce a fluid barrier between the respective pad and wafer surface for holding the wafer without the rigid pads physically contacting the wafer during grinding. This reduces damage to the wafer that may be caused by physical clamping and allows the wafer to move (rotate) tangentially relative to the pad surfaces with less friction. While this grinding process can improve flatness and/or parallelism of the ground wafer surfaces, it can cause degradation of the topology of the wafer surfaces. Specifically, misalignment of the hydrostatic pad and grinding wheel clamping planes are known to cause such degradation. Post-grinding polishing produces a highly reflective, mirrored wafer surface on the ground wafer but does not address topology degradation.

After the grinder 120 grinds the wafer, the wafer is analyzed by a second measurement device 125 measures data to generate a profile for the ground wafer. At this point, the wafer is unetched and unpolished. The second measurement device 125 provides the measurement data from the ground wafer to a wafer surface analysis (WSA) computer device 115. In some embodiments, second measurement device 125 uses a capacitance probe or a laser-based distance sensor to measure the wafers. In particular, the WAS computer device 115 uses post-grinding Shape and GAPI (the gap between raw shape and ideal shape) RMS (root mean square) data to generate In-plane distortion (IPD), Nano-topography (NT), and shape distribution maps for silicon wafers.

The WSA computer device 115 analyzes the measurement data of the wafer to determine the profile of the wafer after polishing. If the determined profile exceeds any quality thresholds, then the WSA computer device 115 may determine that the grinder 120 or other device needs to be adjusted.

The system 100 may include a plurality of grinders 120, where each grinder 120 grinds a wafer, but each wafer may only be ground once. In these embodiments, the WSA computer device 115 tracks the grinding results of each of the plurality of grinders 120.

The system 100 includes a plurality of post grinding devices, such as, but not limited to, an etching device 130 for etching the ground wafer, a surface measurement device 135 for measuring the flatness of the surface of the etched wafer, a polishing device 140 for polishing the etched wafer, and a nanotopography measurement device 145 the nanotopography of the polished wafer. In other embodiments, other devices may be included in the system 100.

The WSA computer device 115 includes a model of the devices in system 100, where the model simulates the etching, polishing, and potentially grinding of a wafer based on the measurements of the wafer to predict the post-polishing surface of the wafer. The post-polishing surface is similar to the surface as measured by the nanotopography measurement device 145. As described further herein, the WSA computer device 115 generates the model based on a plurality of historical data for a plurality of manufactured wafers. The historical data is based on the comparison of the wafers at least one of the first measurement device 110 (post-slicing) or the second measurement device 125 (post-grinding) and at the nanotopography measurement device 145 (post polishing).

The WSA computer device 115 creates a model for each system 100 that it analyzes. For example, a factory may have more than one production line for manufacturing wafers. For each production line, the WSA computer device 115 generates a separate model. In some embodiments, where multiple slicers 105 or grinders 120 use the same post grinder processing, then the WSA computer device 115 may use the same model.

Figure 2:
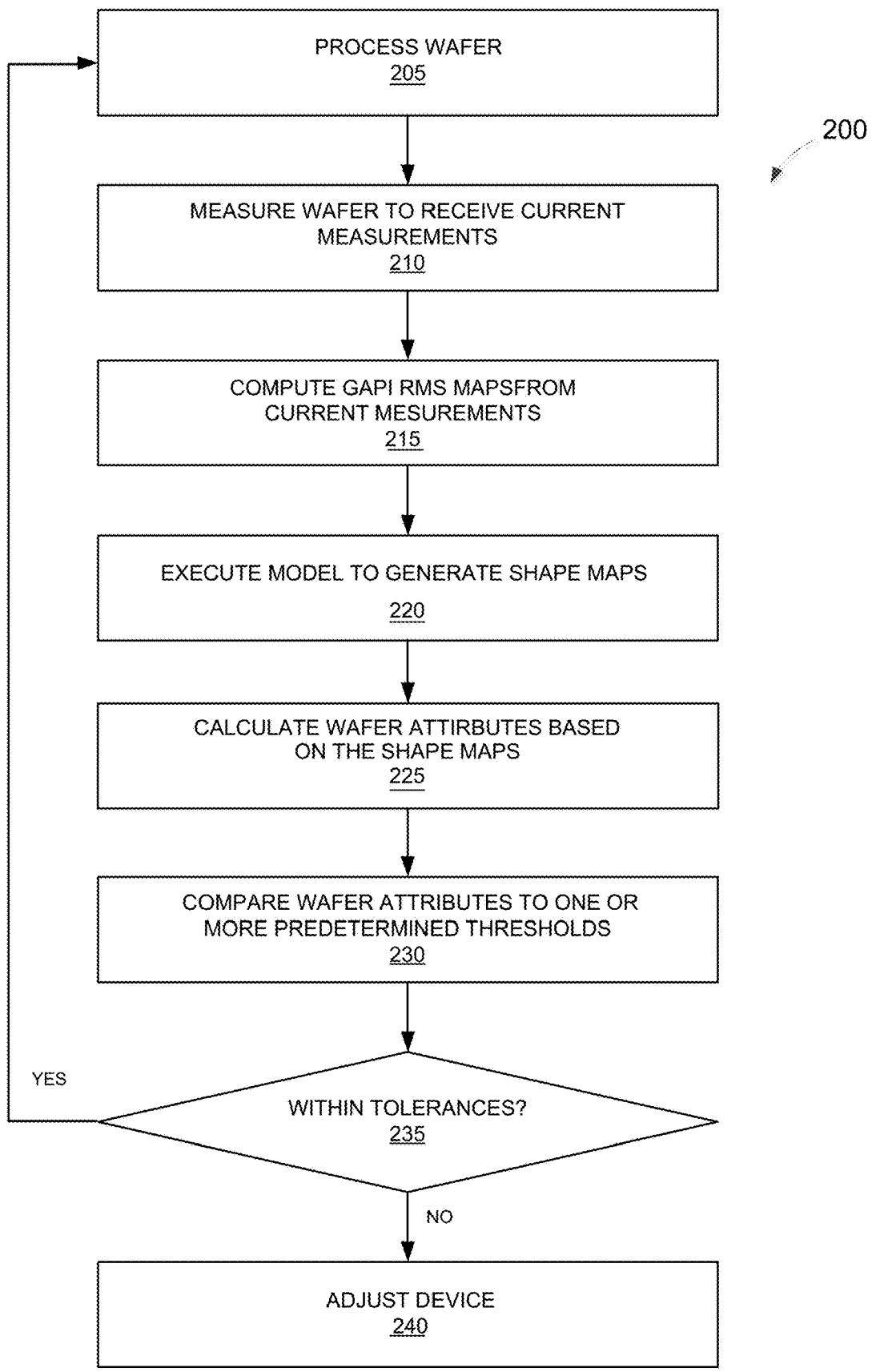
FIG. 2 is a flowchart illustrating an example process of evaluating a wafer using the system shown in FIG. 1.

FIG. 2 is a flowchart illustrating an example process 200 of evaluating a wafer using the system 100 (shown in FIG. 1). In the example embodiment, steps of process 200 are performed by the WSA computer device 115 (shown in 1).

Prior to process 200, at least one neural network model is built. The neural network model is trained with a plurality of historical images. A first neural network model is trained to receive a post-grinding or post-slicing shape map of the wafer and determine a post-polishing NT map from the input shape map. A second neural network model is trained to receive a post-grinding or post-slicing GAPI RMS map of the wafer and determine an IPD map for the wafer. Both of these neural network models are trained with a plurality of historical images and the generative adversarial network (GAN).

The GAN architecture is comprised of a generator model for outputting new plausible synthetic images, and a discriminator model that classifies images as real (from the dataset) or fake (generated). The discriminator model is updated directly, whereas the generator model is updated via the discriminator model. As such, the two models are trained simultaneously in an adversarial process where the generator seeks to better fool the discriminator and the discriminator seeks to better identify the counterfeit images.

For the GAN model described herein, the generation of the output image is conditional on an input, in this case, a source image. The discriminator includes both a source image and the target image and must determine whether the target is a plausible transformation of the source image. The generator is trained via adversarial loss, which encourages the generator to generate plausible images in the target domain. The generator is also updated via L1 loss measured between the generated image and the expected output image. This additional loss encourages the generator model to create plausible translations of the source image. The input for the models may be either four line scan data or eight line scan data. Further discussion of training the models is described below.

Wafer processing 205 may include slicing by the slicer 105 and/or grinding by the grinder 120 (both shown in FIG. 2). After processing 205, at least one of the first measurement device 110 and the second measurement device 125 (both shown in FIG. 1) measures 210 the ground wafer and transmits the current post-post processing measurements to the WSA computer device 115. The WSA computer device 115 computes 215 the GAPI RMS maps from the current measurements and computes the GAPI RMS maps from pre-defined algorithms.

The WSA computer device 115 executes 220 the aforementioned neural network models to generate shape maps, such as the post-polishing NT map and/or the IPD map. For the purposes of this disclosure, the neural network model can convert shape maps to post-polishing NT maps or GAPI RMS maps to IPD maps. Then the WSA computer device 115 calculates 225 predicted wafer attributes based on the shape maps. These wafer attributes can include, but are not limited to, mean IPD, THA1010, and THA2525. THA1010 and THA2525 are Nanotopography Parameters calculated based on Nanotopography Maps. THA1010 is calculated by recording peak to valley difference value in a moving window of 10 mm by 10 mm size, that is moved over the entire wafer and then a certain percentile of this recorded values set is deemed as the THA1010 value. The percentile value can vary and is usually specified by the end consumer. THA2525 is similar to THA1010, except that the window can be a 25 mm by 25 mm square or a circle with a diameter of 25 mm. The wafer attributes predict the state of wafer at the end of processing, such as measured by the nanotopography measurement device 145.

The WSA computer device 115 compares 230 the wafer attributes to one or more predetermined thresholds. In the example embodiment, the predetermined thresholds are requirements for the proper surface of the wafer post polishing. In the example embodiment, some of the predetermined thresholds and/or requirements are based on one or more user preferences, from the manufacturer of the wafer and/or the customer purchasing the wafer.

If the wafer attributes are within tolerances 235 the WSA computer device 115 stores the data and moves to analyzing the next wafer. The stored wafer attributes may then be used to refine the neural networks and/or to detect one or more trends. If the wafer attributes are not within tolerances 235, then the WSA computer device 115 triggers an alert and potentially adjusts 240 one or more devices, such as, but not limited to, the slicer 105, the grinder 120, the etching device 130, and the polishing device 140. In some embodiments, the WSA computer device 115 directly adjusts 240 the device(s). In other embodiments, the WSA computer device 115 instructs another device to adjust 240 the device(s). In still further embodiments, the WSA computer device 115 instructs a user to adjust 240 the device(s).

The WSA computer device 115 determines that the wafer is within tolerances 235, but also determines that one or more of the device(s) is becoming no longer properly adjusted. In these embodiments, the WSA computer device 115 may determine that the device is coming out of proper adjustment based on a current trend of the post processing inspections of a plurality of wafers. The WSA computer device 115 may recognize the trend and determine that the device will need adjustment in a specific number of uses or after a period of time. In these embodiments, the WSA computer device 115 may determine when the next planned period of downtime is for the system 100. If the planned period of downtime is before the device is expected to come out of proper adjustment, the WSA computer device 115 may schedule the device adjustment to occur during the planned period of downtime. The WSA computer device 115 may determine when the device is expected to generate out of tolerance wafers based on the one or more predetermined thresholds, the amount of change in post processing results for each wafer, and the model.

The WSA computer device 115 generates the model based on a plurality of historical data including past post slicing measurements by the first measurement device 110 or post grinding measurements by the second measurement device 125 and past post polishing measurements by the nanotopography measurement device 145. In the example embodiment, the WSA computer device 115 generates the model by comparing the post-slicing/post-grinding images and post polishing image of wafers to determine how the system 100 changes the wafer as it is processed. In some embodiments, the WSA computer device 115 stores a general model that is trained for a specific production line (system 100) using historical inspection data from that production line. In other embodiments, the WSA computer device 115 generates the model completely from the historical data of that production line. In some further embodiments, the model is continually updated based on the measurement data of the nanotopography measurement device 145 of the production line as it is in production. This allows the model to most accurately model the current production line (system 100). In other embodiments, the model is only updated or calibrated every six months or other predetermined period of time. This embodiment is best where the other devices in the system 100 do not change or require re-calibration on a regular basis. In some embodiments, every time a device is replaced, calibrated, or otherwise changed, the model is updated and calibrated for the current state of the production line.

While the system 100 and process 200 are described for a semiconductor wafer manufacturing assembly line, one of skill in the art would understand that this disclosure may be used with other assembly lines. In these other embodiments, system 100 would be considered the assembly line 100 for creating a product. The assembly line includes a first device 105, a first inspection station 110, a computer device 115, a second device 140, a second inspection station 145, and potentially a third device 120, and a third inspection station 125. In these other embodiments, the computer device 115 store, in the at least one memory device, a model for simulating a portion of an assembly line 100. The computer device 115 receives scan data of a first inspection of a product being assembled. The first inspection is conducted at the first inspection station 110 (or 125) in the assembly line 100 subsequent to the first device 105 (or 120) in the assembly line 100. The computer device 115 executes 220 the model using the scan data as inputs to generate a final profile and or attributes of the product.

The computer device 115 compares 230 the final profile to one or more thresholds. The computer device 115 determines 235 if the final profile exceeds one or more tolerance by exceeding at least one of the one or more thresholds. If the determination is that the final profile exceeds at least one of the one or more thresholds, the computer device 115 cause the first device 105 (or 120) to be adjusted 240.

Computer device 115 may generate the model for simulating a portion of an assembly line 100 based on a plurality of inspection data of that assembly line 100. The model generates the final profile of the product, which simulates an actual profile of the product upon reaching the second inspection station 145. In some further embodiments, the second inspection station 145 is positioned subsequent to completion of the assembly line 100. In some embodiments, the plurality of inspection data includes a first plurality of scan data of a plurality of individual products at the first inspection station 110 and a second plurality of scan data of the plurality of individual products at the second inspection station 145. In some still further embodiments, the computer device 115 receives scan data of a second inspection of a product being assembled at the second inspection station 145. The computer device 115 compares the scan data of the second inspection to the final profile. The computer device 115 adjusts the model based on the comparison.

In other embodiments, the computer device 115 generates the model for simulating a portion of the assembly line 100. The model generates the final profile and attributes of the product, which simulates an actual profile of the product upon reaching the final inspection stations 145. The model may receive scan data from a first inspection station 110 after a first processing station 105 and/or scan data from a second inspection station 125 after a second processing station 120. The computer device 115 then generates the profile of the product based on the input from both of the inspection stations 110 and 125.

If the determination is made that the final profile exceeds at least one of the one or more thresholds, the computer device 115 analyzes a plurality of prior inspections to determine a trend. The computer device 115 predicts if a subsequent inspection of a subsequent product may exceed at least one of the one or more thresholds based on the trend. The computer device 115 adjusts the first device 105 or the second device 120 based on the trend.

Figure 3:
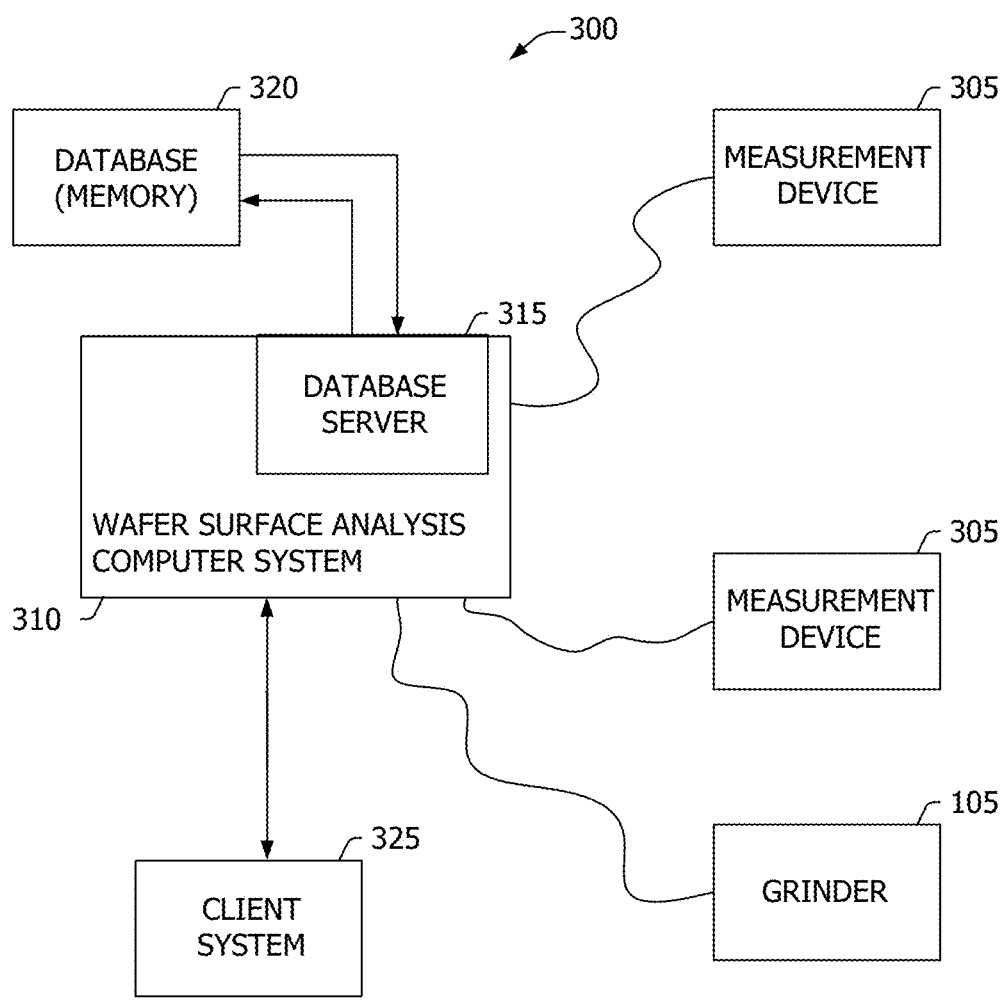
FIG. 3 is a simplified block diagram of an example system for evaluating a wafer using the process shown in FIG. 2 in accordance with the system shown in FIG. 1.

FIG. 3 is a simplified block diagram of an example system 300 for evaluating a wafer using the process 200 (shown in FIG. 2) in accordance with the system 100 (shown in FIG. 1). In the example embodiment, system 300 is used for analyzing wafers post-grinding to determine if they will be within tolerance post-polishing. In addition, system 300 is a real-time data analyzing and classifying computer system that includes a wafer surface analysis (WSA) computer device 310 (also known as a WSA server) configured to analyze wafers and predict future states based on the analysis.

A measurement device 305 is configured to scan the surface of a wafer to generate a profile of that wafer. More specifically, the measurement device 305 scans the nanotopography of the wafer and is in communication with the WSA computer device 310. The measurement device 305 connects to the WSA computer device 310 through various wired or wireless interfaces including without limitation a network, such as a local area network (LAN) or a wide area network (WAN), dial-in-connections, cable modems, Internet connection, wireless, and special high-speed Integrated Services Digital Network (ISDN) lines. The measurement device 305 receives data about the surface of a wafer and reports that data to the WSA computer device 310. In other embodiments, the measurement device 305 is in communication with one or more client systems 325 and the client systems 325 route the measurement data to the WSA computer device 310 in real-time or near real-time. In some embodiments, a first measurement device 305 measures one side of the wafer and a second measurement device 305 measures the other side of the wafer. In the example embodiment measurement device 305 is similar to first measurement device 110 (shown in FIG. 1), second measurement device 125 (shown in FIG. 1), and nanotopography measurement device 145 (shown in FIG. 1).

As described above in more detail, the WSA server 310 is programmed to analyze wafers to predict the nanotopography of the wafer surface post-polishing to allow the system 300 to respond to changes that would cause the wafer to be out of tolerance quickly. The WSA server 310 is programmed to determine current conditions of a wafer; (2) predict a post-processing state of conditions of the wafer based on the current conditions and the model; and (3) determine if adjustments need to be made to the wafer processing device based on the post-processing state of the wafer and one or more predetermined thresholds. In the example embodiment, the WSA server 310 is similar to wafer surface analysis computer device 115 (shown in FIG. 1).

Client systems 325 are computers that include a web browser or a software application, which enables client systems 325 to communicate with the WSA server 310 using the Internet, a local area network (LAN), or a wide area network (WAN). In some embodiments, client systems 325 are communicatively coupled to the Internet through many interfaces including, but not limited to, at least one of a network, such as the Internet, a LAN, a WAN, or an integrated services digital network (ISDN), a dial-up-connection, a digital subscriber line (DSL), a cellular phone connection, a satellite connection, and a cable modem. Client systems 325 can be any device capable of accessing a network, such as the Internet, including, but not limited to, a desktop computer, a laptop computer, a personal digital assistant (PDA), a cellular phone, a smartphone, a tablet, a phablet, or other web-based connectable equipment.

A database server 315 is communicatively coupled to a database 320 that stores data. In one embodiment, database 320 is a database that includes historical data and the model. In some embodiments, database 320 is stored remotely from WSA server 310. In some embodiments, database 320 is decentralized. In the example embodiment, a person can access database 320 via client systems 325 by logging onto WSA server 310.

Figure 4:
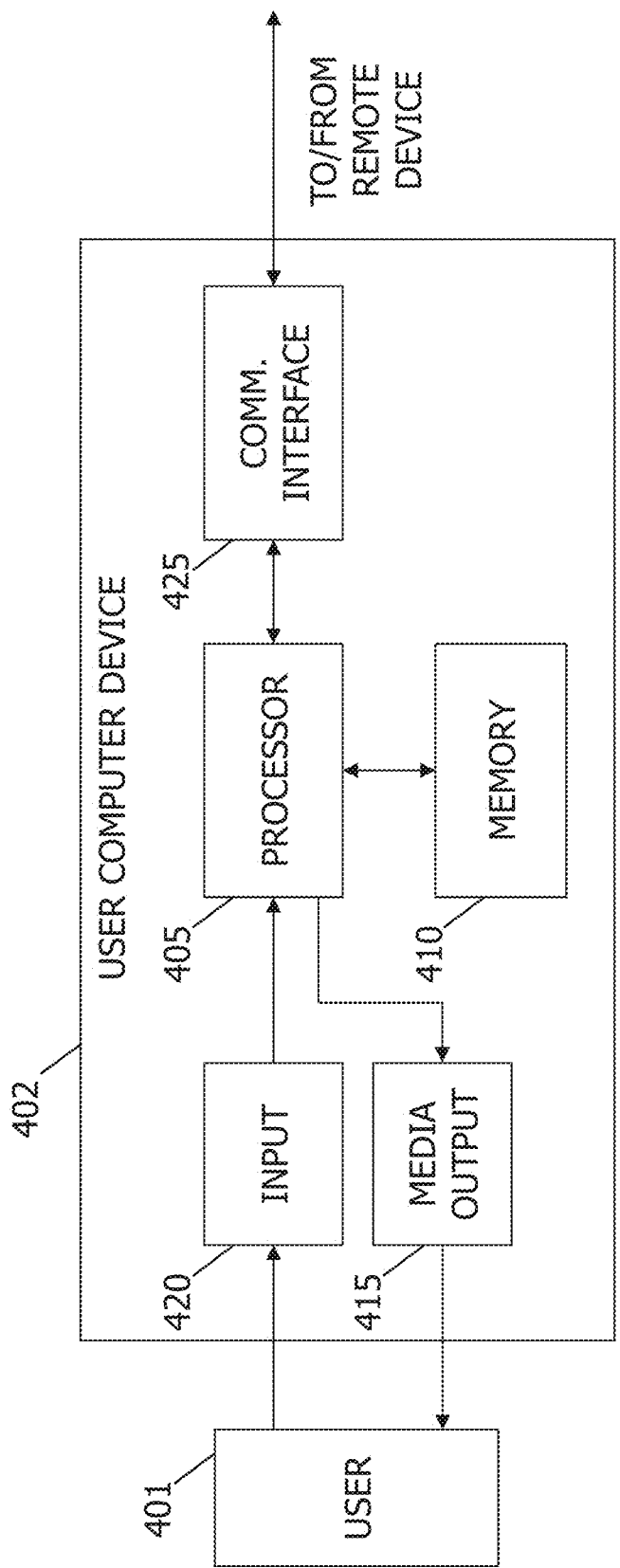
FIG. 4 illustrates an example configuration of a client computer device shown in FIG. 3.

FIG. 4 illustrates an example configuration of client system 325 (shown in FIG. 3). User computer device 402 is operated by a user 401. User computer device 402 may include, but is not limited to, first measurement device 110, second measurement device 125, wafer surface analysis computer device 115, nanotopography measurement device 145 (all shown in FIG. 1), measurement device 305, WSA computer device 310, and client systems 325 (all shown in FIG. 3). User computer device 402 includes a processor 405 for executing instructions. In some embodiments, executable instructions are stored in a memory area 410. Processor 405 may include one or more processing units (e.g., in a multi-core configuration). Memory area 410 is any device allowing information such as executable instructions and/or transaction data to be stored and retrieved. Memory area 410 may include one or more computer-readable media.

User computer device 402 also includes at least one media output component 415 for presenting information to user 401. Media output component 415 is any component capable of conveying information to user 401. In some embodiments, media output component 415 includes an output adapter (not shown) such as a video adapter and/or an audio adapter. An output adapter is operatively coupled to processor 405 and operatively coupleable to an output device such as a display device (e.g., a cathode ray tube (CRT), liquid crystal display (LCD), light emitting diode (LED) display, or "electronic ink" display) or an audio output device (e.g., a speaker or headphones). In some embodiments, media output component 415 is configured to present a graphical user interface (e.g., a web browser and/or a client application) to user 401. A graphical user interface may include, for example, an interface for viewing the results of the analysis of one or more wafers. In some embodiments, user computer device 402 includes an input device 420 for receiving input from user 401. User 401 may use input device 420 to, without limitation, select a wafer to view the analysis of. Input device 420 may include, for example, a keyboard, a pointing device, a mouse, a stylus, a touch sensitive panel (e.g., a touch pad or a touch screen), a gyroscope, an accelerometer, a position detector, a biometric input device, and/or an audio input device. A single component such as a touch screen may function as both an output device of media output component 415 and input device 420.

User computer device 402 may also include a communication interface 425, communicatively coupled to a remote device such as WSA server 310 (shown in FIG. 3). Communication interface 425 may include, for example, a wired or wireless network adapter and/or a wireless data transceiver for use with a mobile telecommunications network.

Stored in memory area 410 are, for example, computer-readable instructions for providing a user interface to user 401 via media output component 415 and, optionally, receiving and processing input from input device 420. A user interface may include, among other possibilities, a web browser and/or a client application. Web browsers enable users, such as user 401, to display and interact with media and other information typically embedded on a web page or a website from WSA server 310. A client application allows user 401 to interact with, for example, WSA server 310. For example, instructions may be stored by a cloud service, and the output of the execution of the instructions sent to the media output component 415.

Processor 405 executes computer-executable instructions for implementing aspects of the disclosure. In some embodiments, the processor 405 is transformed into a special purpose microprocessor by executing computer-executable instructions or by otherwise being programmed.

Figure 5:
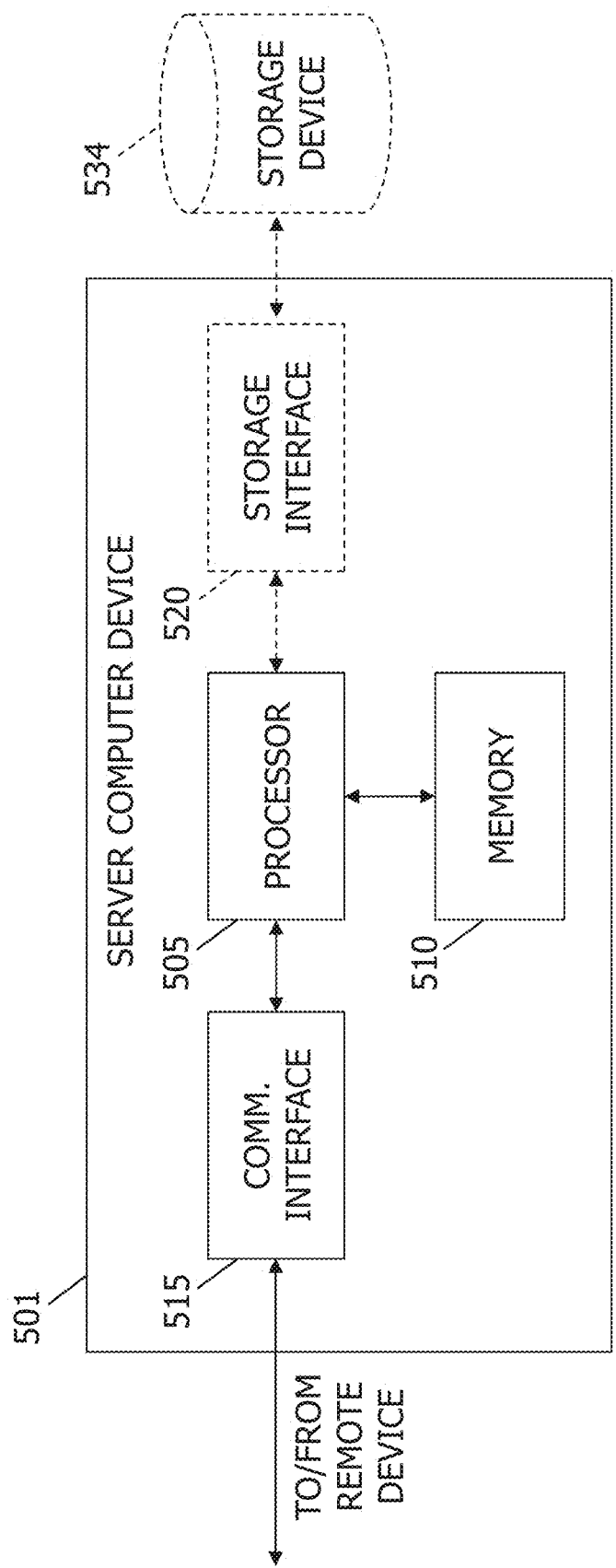
FIG. 5 illustrates an example configuration of the server system shown in FIG. 3.

FIG. 5 illustrates an example configuration of the server system 310 shown in FIG. 3. Server computer device 501 may include, but is not limited to, WSA computer device 115 (shown in FIG. 1), database server 315, and WSA server 310 (both shown in FIG. 3). Server computer device 501 also includes a processor 505 for executing instructions. Instructions may be stored in a memory area 510. Processor 505 may include one or more processing units (e.g., in a multi-core configuration).

Processor 505 is operatively coupled to a communication interface 515 such that server computer device 501 is capable of communicating with a remote device such as another server computer device 501, another WSA server 310, or client system 325 (shown in FIG. 3). For example, communication interface 515 may receive requests from client system 325 via the Internet, as illustrated in FIG. 3.

Processor 505 may also be operatively coupled to a storage device 534. Storage device 534 is any computer-operated hardware suitable for storing and/or retrieving data, such as, but not limited to, data associated with database 320 (shown in FIG. 3). In some embodiments, storage device 534 is integrated in server computer device 501. For example, server computer device 501 may include one or more hard disk drives as storage device 534. In other embodiments, storage device 534 is external to server computer device 501 and may be accessed by a plurality of server computer devices 501. For example, storage device 534 may include a storage area network (SAN), a network attached storage (NAS) system, and/or multiple storage units such as hard disks and/or solid state disks in a redundant array of inexpensive disks (RAID) configuration.

Processor 505 may be operatively coupled to storage device 534 via a storage interface 520. Storage interface 520 is any component capable of providing processor 505 with access to storage device 534. Storage interface 520 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 505 with access to storage device 534.

Processor 505 executes computer-executable instructions for implementing aspects of the disclosure. In some embodiments, the processor 505 is transformed into a special purpose microprocessor by executing computer-executable instructions or by otherwise being programmed. For example, the processor 505 is programmed with instructions such as illustrated in FIG. 2.

Figure 6:
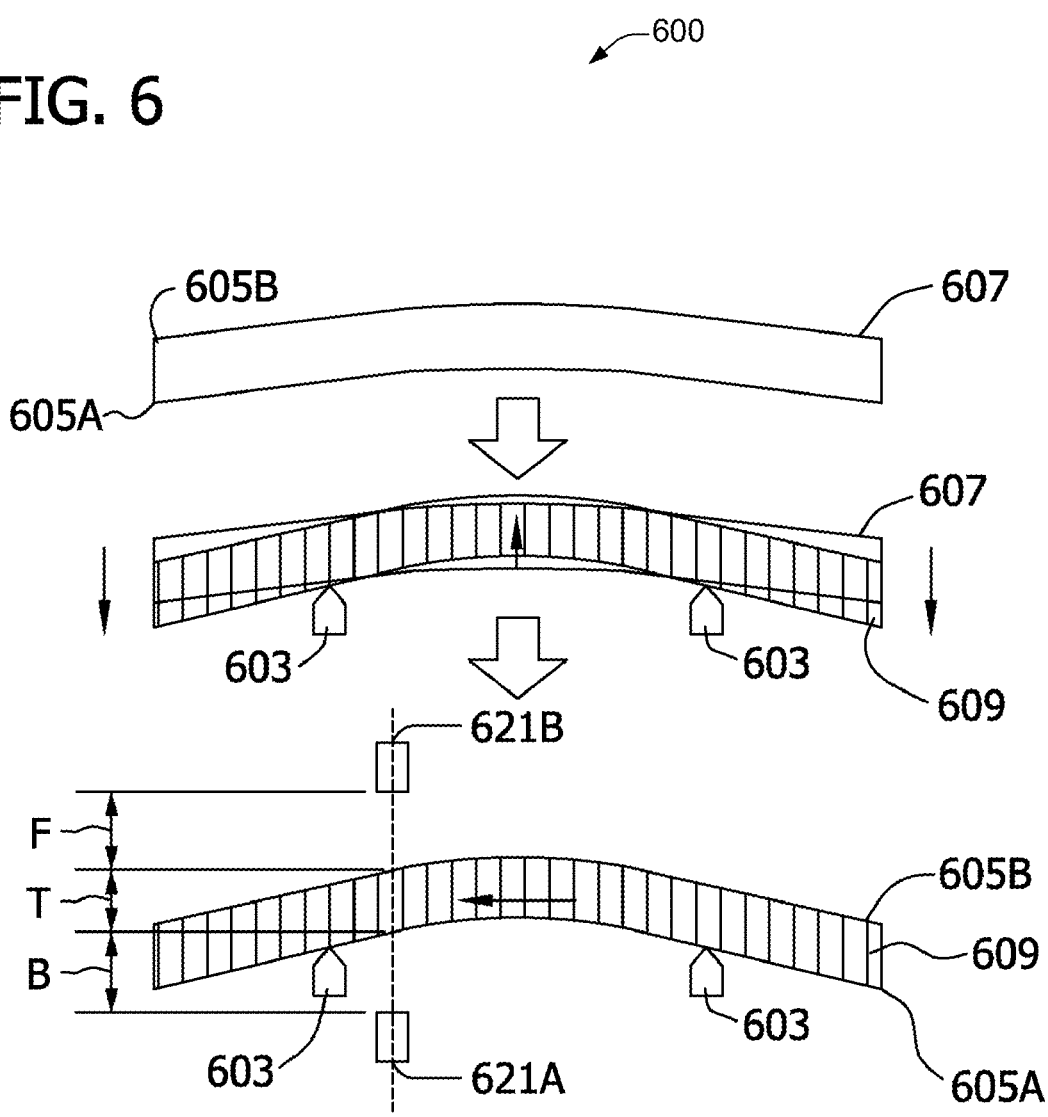
FIG. 6 is a diagram illustrating an example line scanning process executed by a measurement device.

FIG. 6 is a diagram illustrating an example line scanning process 600 executed by a measurement device 305 (shown in FIG. 3). In the example embodiment, process 600 is performed by first measurement device 110, second measurement device 125, and nanotopography measurement device 145 as a part of system 100 (all shown in FIG. 1) and process 200 (shown in FIG. 2).

According to the line scanning process 600, the wafer W is supported by one or more support pins 603 in contact with a first surface 605A of the wafer. As illustrated by a comparison between a shape of the wafer in a gravity-free state (indicated with reference number 607) to a shape of the wafer in the supported state (indicated with reference number 609), the shape of the supported wafer 609 is deflected as a function of gravity and a mass of the wafer W. The measurement device 305 includes a first electrostatic capacitive sensor 621A for measuring a plurality of distances (e.g., "Distance-B") between the first sensor 621A and a first surface 605A (e.g., front surface) along a diameter of the supported wafer 609. Similarly, the measurement device 305 includes a second electrostatic capacitive sensor 621B for measuring a plurality of distances (e.g., "Distance-F") between the second sensor 621B and a second surface 605B (e.g., back surface) along a diameter of the supported wafer 609. The obtained data includes a line scan data set corresponding to the diameter. The line scan data set comprises the plurality of distances measured by the first sensor 621A along the diameter of the supported wafer 609 and the plurality of distances measured by the second sensor 621B along the diameter of the supported wafer 609. The line scan data set is indicative of the wafer profile along the diameter.

Figure 7A:
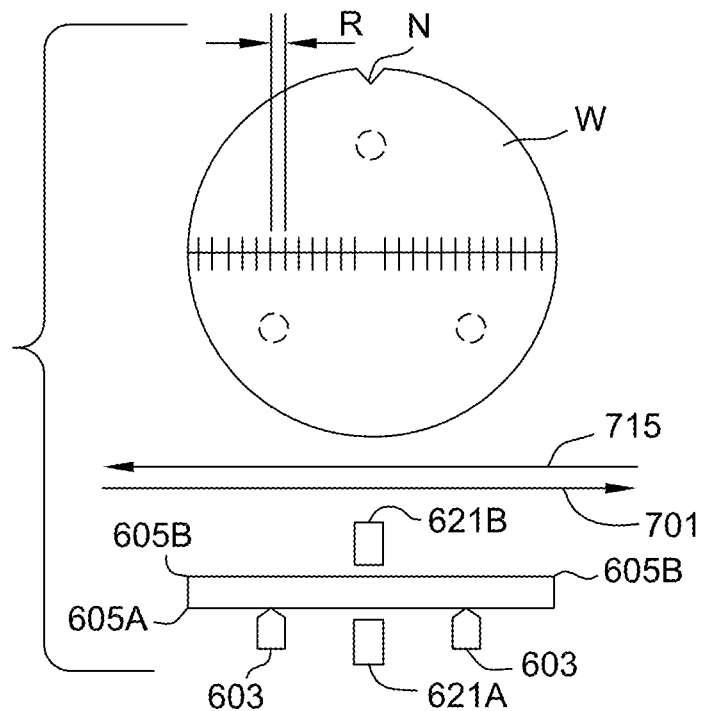
FIGS. 7A and 7B are diagrams further illustrating the example line scanning process shown in FIG. 6.
Figure 7B:
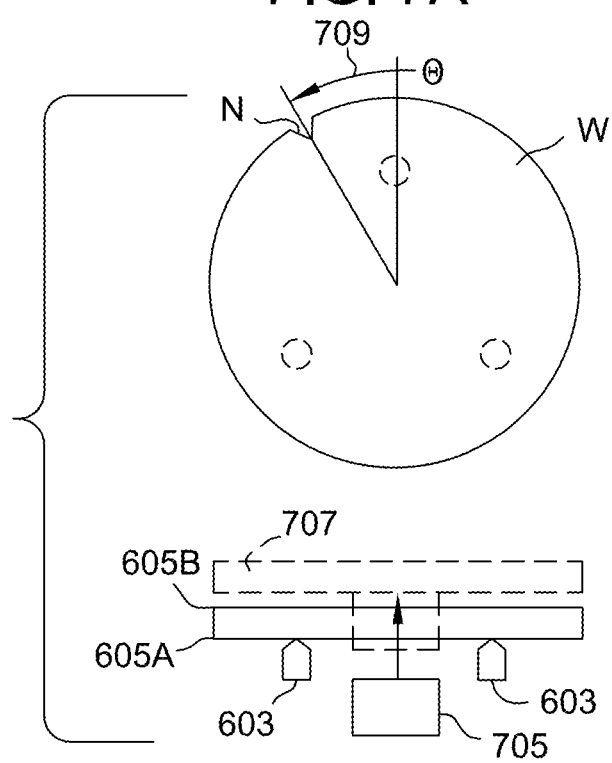

FIGS. 7A and 7B are diagrams further illustrating the example line scanning process 600 (shown in FIG. 6). FIGS. 7A and 7B illustrate the line scanning process 600 executed by a measurement device 305 for obtaining a plurality of line scan data sets, each indicative of a wafer profile along a particular diameter. As illustrated by FIG. 7A, a first line scan (indicated by arrow 701) is executed along a first diameter of the wafer. In particular, the first sensor 621A is moved in a plane above the first surface 605A in a first direction along the first diameter of the wafer. The first sensor 621A measures the distance between the first sensor 621A and the first surface 605A of the wafer at pre-defined intervals (i.e., pitch R, measurement frequency). The pre-defined intervals are illustrated as has marks on the surface of wafer W in FIG. 7A, For instance, the first sensor 621A may measure the distance at 1 or 2 mm intervals along the first diameter of the wafer. The second sensor 621B is similarly moved in a plane below the second surface 605B in the first direction to measure the distance between the second sensor 621B and the second surface 605B along the first diameter of the wafer. The first diameter of the wafer may be defined as a function of a reference point. For example, in the illustrated process, the first diameter passes through the notch N located on the perimeter of the wafer.

As illustrated by FIG. 7B, after completing the first line scan 701, the wafer W is rotated (indicated by arrow 709). In particular, a rotation stage 705, positioned below the support pins 603, is raised to lift the wafer W to a position (indicated by reference number 707) above the support pins 603. While supporting the wafer in the lifted position 707, the rotation stage rotates. As a result, the wafer is rotated a number of degrees (θ). The rotation stage 705 is lowered and the rotated wafer is re-positioned on the support pins 603. The positions of the support pins 603 with respect to the second surface of the wafer are indicated with hidden lines in FIGS. 7A and 7B. In turn, a line scan (indicated by arrow 715) along a second diameter of the wafer is executed, According to the illustrated process, the first and second sensors 621A and 621B are moved in planes respectively corresponding to the first and second surfaces 605A and 605B in a second direction (e.g., opposite to the first direction) along the second diameter of the wafer. As explained above in connection with the first line scan 701, the first and second sensors 621A and 621B respectively measure the distances between the sensors 621A and 621B and the first and second surfaces 605A and 605B of the wafer at the pre-defined intervals along the second diameter of the wafer. The rotation 709 and line scanning operations 701 and 705 are repeated in order to obtain each of the plurality of line scan data sets.

The measurement device 305 suitably uses a self-mass compensation algorithm to determine the wafer shape for a gravity free state 607. The self-mass compensation determines the shape of the wafer as a function of the line scan data sets, wafer density, an elastic constant, the diameter of the wafer, and the positions of the support pins 603. In one embodiment, measurement device 305 measures one or more wafer parameters based on the wafer shape. The wafer parameters may include one or more of the following: warp, bow, TTV (total thickness variation), and/or GBIR (global back surface ideal range).

Figure 8A:
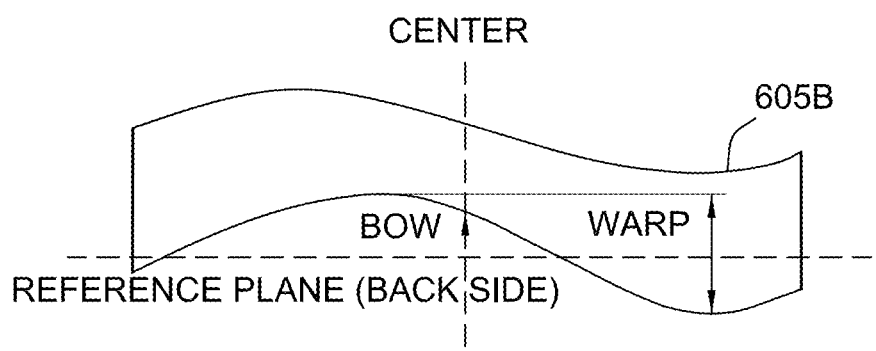
FIGS. 8A and 8B are side diagrams of a wafer.
Figure 8B:
Figure 9A:
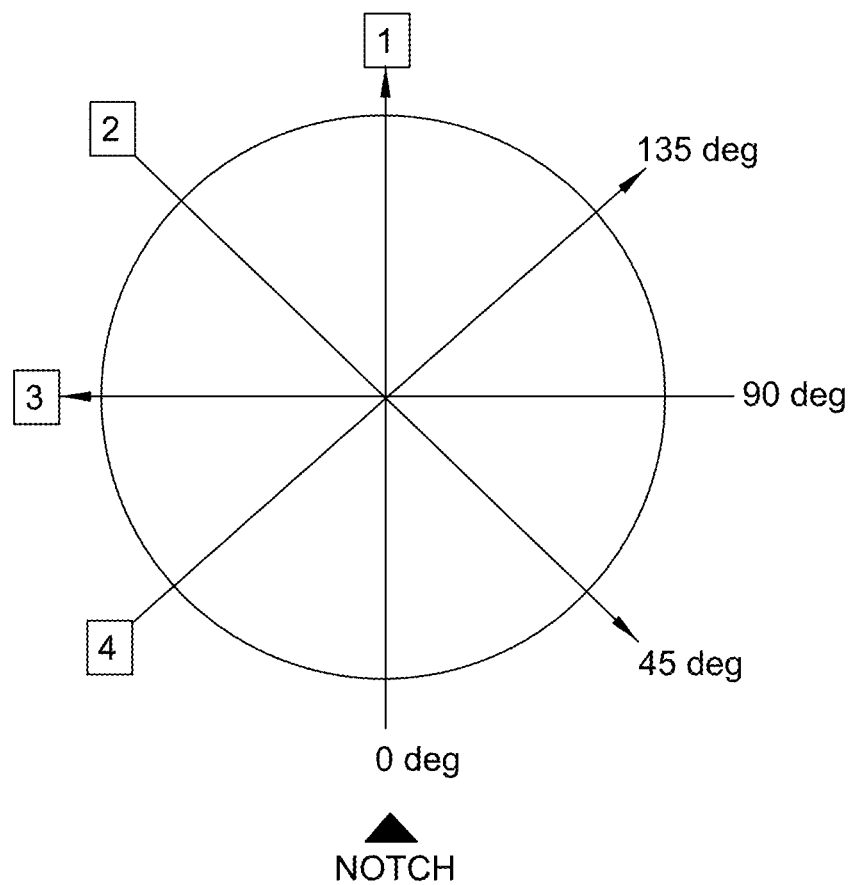
FIGS. 9A and 9B are top side views of a wafer illustrating the scan lines obtained for the wafer.
Figure 9B:
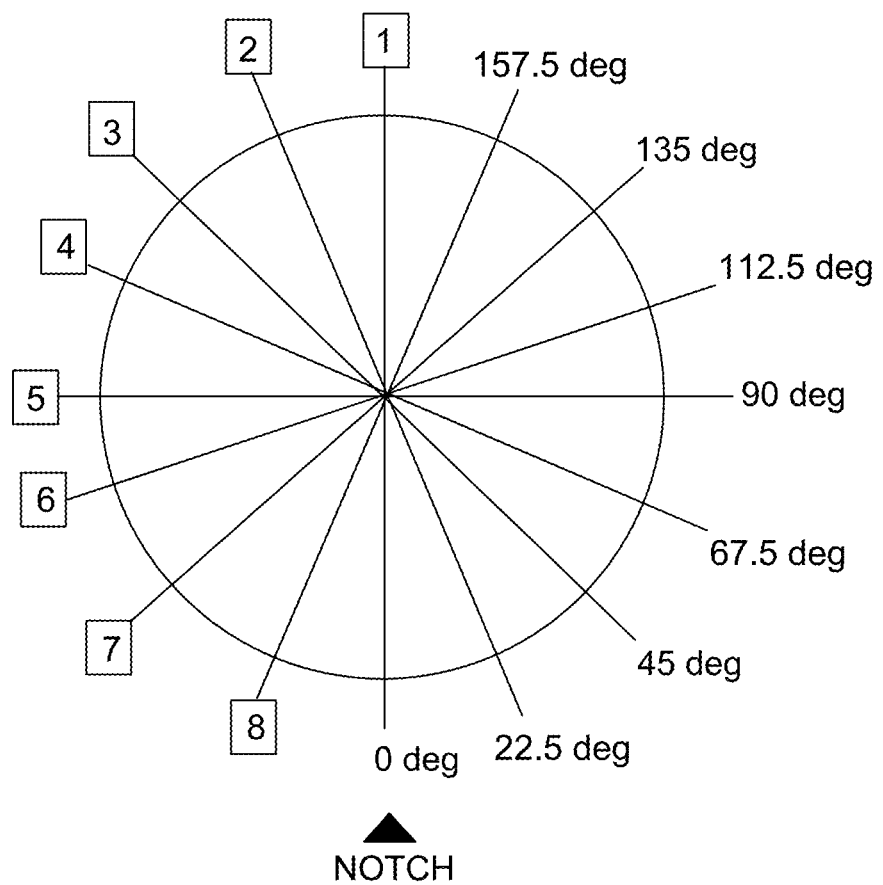

Referring to FIG. 8A, warp and bow are generally determined with respect to a reference plane. The reference plane is defined as a function the contact points between the support pins 603 and the surface 605A of the wafer. Specifically, warp is defined as the absolute value of the difference between maximum deviation and minimum deviation of the median area from the reference plane. The median area is a locus of points which are equidistant from the front surface 605B of the wafer and the back surface 605A of the wafer. Bow is defined as the amount of deviation from the reference plane at the wafer center. Referring to FIG. 8B, GBIR and TTV reflect the linear thickness variation of the wafer and can be computed based on a difference between a maximum and a minimum distance from the back surface of the wafer to the reference plane. For example, the measurement device 305 may obtain four line scan data sets as illustrated by FIG. 9A or eight line scan data sets as illustrated in FIG. 9B, Each line scan data set is indicative of a diametric profile of the wafer.

Referring again to the system 100 illustrated in FIG. 1, the data obtained by the measurement device 110, 125, and 145 for measuring the nanotopography of the wafer as ground by the grinder 120 is transmitted to the WSA computer device 115. For example, the line scan data sets and/or the determined wafer shape may be transmitted to the WSA computer device 115. The WSA computer device 115 receives the scan data and executes computer-executable instructions for performing a plurality of operations for processing the received scan data as described herein. In particular, the WSA computer device 115 predicts a post polishing nanotopography of the wafer based on the received scan data. In some embodiments, the WSA computer device 115 determines a grinding parameter based on the predicted nanotopography of the wafer. The operation of the grinder 120 is adjusted accordingly.

The WSA computer device 115 may access a feedback program for processing the received scan data. The received scan data may include the line scan data sets and/or the determined wafer shape for the ground wafer. In particular, the WSA computer device 115 predicts a nanotopography of the post polished wafer based on the received warp data. The nanotopography of the wafer is predicted, rather than actually measured, since when the first measurement device 110 or the second measurement device 125 measures the wafer, the wafer has not Yet undergone polishing. The WSA computer device 115 determines one or more grinding parameters based on the predicted nanotopography of the wafer. In one embodiment, the WSA computer device 115 determines a shift parameter. The shift parameter is indicative of a magnitude and a direction for moving the pair of grinding wheels in order to reduce nanotopography degradation caused by misalignment of the grinding wheels. In another embodiment, the WSA computer device 115 additionally or alternatively determines a tilt parameter. The tilt parameter is indicative of an angle for positioning the pair of grinding wheels with respect to a wafer in order to reduce nanotopography degradation caused by misalignment of the grinding wheels.

The operation of the grinder 120 or other stations is adjusted based on the determined parameters. For example, in the case of the grinder 120, the grinding wheels may be adjusted as specified by the determined shift and/or tilt parameters. In one embodiment, the grinding wheels are adjusted as a function of the determined shift and/or tilt parameters and of a previously defined compensation amount. In one embodiment, the grinder 120 is configured to receive the determined grinding parameters and adjust one or more components of the grinder 120 as a function of the determined grinding parameters. In another embodiment, the determined grinding parameters are provided to an operator and the operator configures the grinder 120 to adjust one or more components of the grinder 120 as a function of the determined grinding parameters.

Figure 10A:
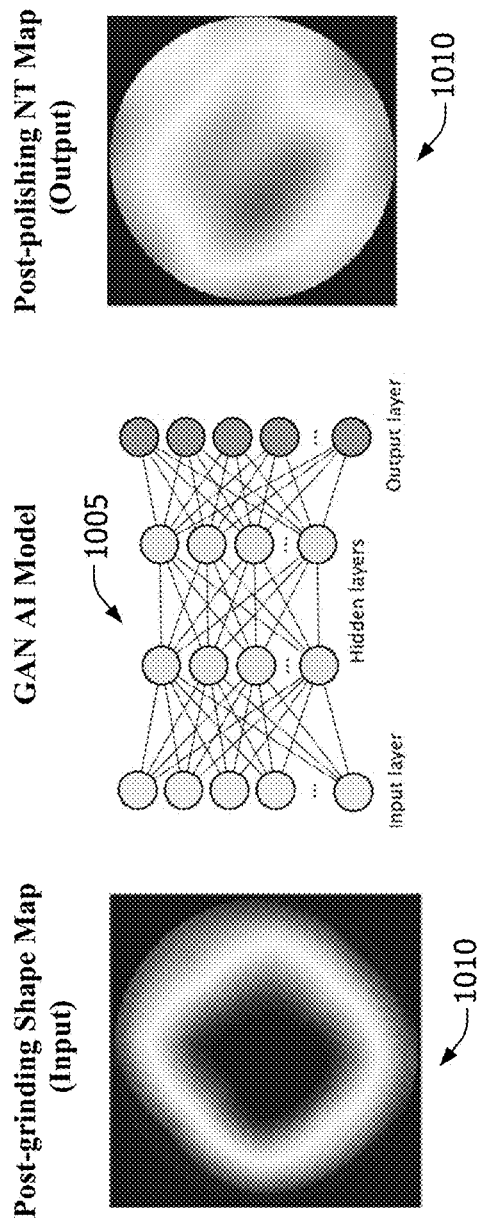
FIG. 10A illustrates using the trained neural network model to convert a post-grinding shape map into a predicted post-polishing NT map.
Figure 10B:
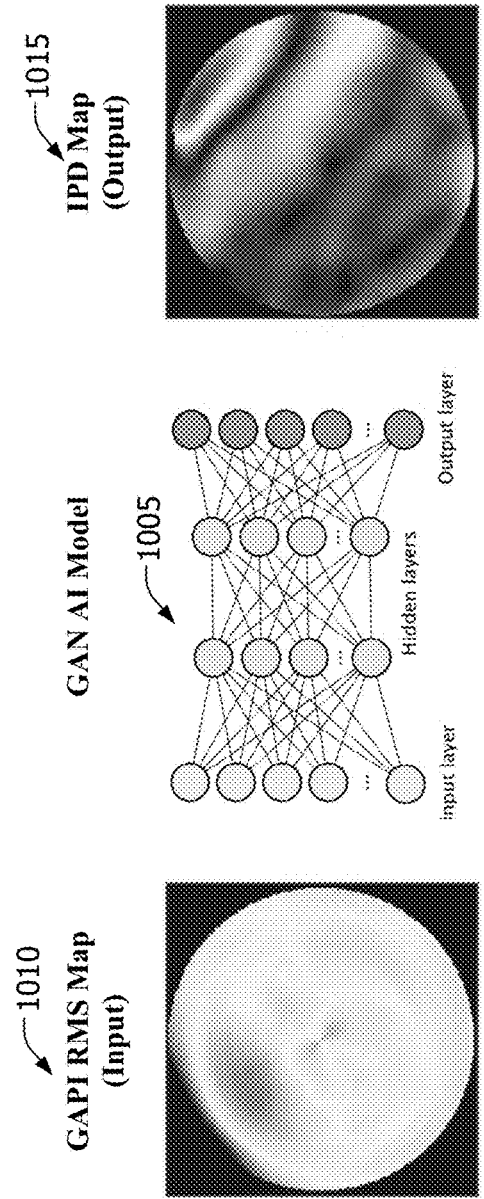
FIG. 10B illustrates using the trained neural network model to convert a GAPI RMS map into a predicted IPD map.

FIG. 10A illustrates using the trained neural network model to convert a post-grinding shape map into a predicted post-polishing NT map. FIG. 10B illustrates using the trained neural network model to convert a GAPI RMS map into a predicted IPD map. The GAN AI model 1005, which can be a neural network or other artificial intelligence or machine learning based model, receives input images 1010 and outputs predicted output images. 1015. The input images 1010 can include shape maps as shown in FIG. 10A or GAPI RMS maps as shown in FIG. 10B.

The GAN AI model 1005 is trained on the large datasets to correlate input data 1010 to output maps 1015. In the first example, shown in FIG. 10A, post-grinding (or post-slicing) line data, such as 4- or 8-line scans, is taken by first measurement device 110 or second measurement device 125 (both shown in FIG. 1). The line data is used to make a shape map. The shape map is used as an input image 1010 to the model 1005. The model 1005 then outputs the predicted post-polishing nanotopography (NT) map as an output image 1015. In some embodiments, the trained model 1005 provides a correlation between post-grinding 4- or 8-line scan data 1010 and NT maps 1015 with R2 around 80%.

In the second example, shown in FIG. 10B, GAPI RMS maps are taken by first measurement device 110 or second measurement device 125 (both shown in FIG. 1). The GAPI RMS maps are used as an input image 1010 to the model 1005. The model 1005 then outputs the predicted shape-based in-plane distortion (IPD) maps as output images 1015. In some embodiments, the trained model 1005 provides a correlation between GAPI RMS maps 1010 and IPD maps 1015 with R2 around 90%.

Once both the NT and IPD maps are available, the WSA computer device 310 can calculate different parameters such as, but not limited to: THA1010, THA2525, mean IPD etc. The WSA computer device 310 can use these parameters can be used to optimize grinding, slicing, and polishing processes during manufacturing of silicon wafers.

Figure 11A:
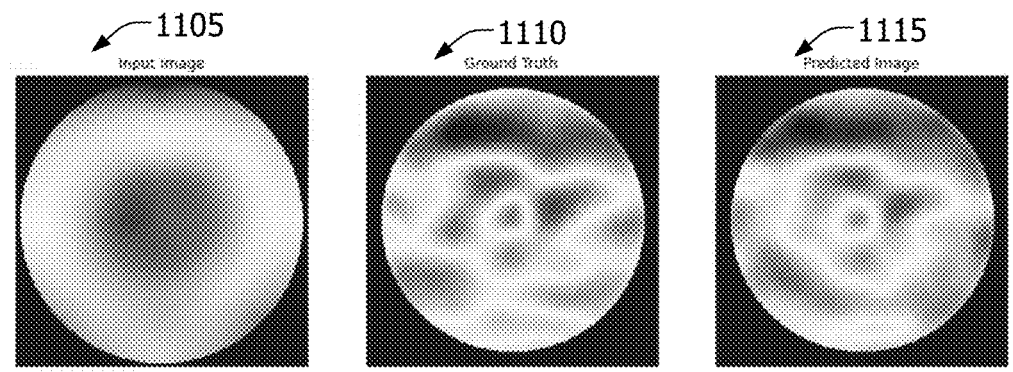
FIG. 11A illustrates images of wafer shape maps.

FIG. 11A illustrates images of wafer shape maps. The first image is an input image 1105, specifically a smooth post-grinding data set map. The second image is a ground truth image 1110, which is an actual post-polishing measured wafer. The ground truth image 1110 may be measured by the nanotopography measurement device 145 (shown in FIG. 1). The third image is a predicted NT map 1115.

Figure 11B:
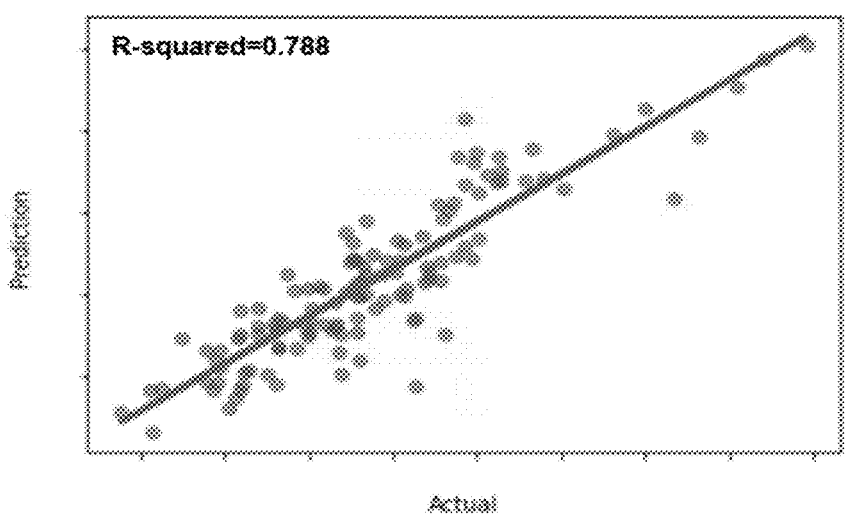
FIG. 11B illustrates an example graph comparing the ground truth image to the predicted NT map shown in FIG. 11A.

FIG. 11B illustrates an example graph comparing the ground truth image 1110 to the predicted NT map 1115 (both shown in FIG. 11A). In this example, the TH2525 is calculated for both the ground truth image 1110 and the predicted NT map 1115. The graph in FIG. 11B illustrates the correlation between the ground truth image 1110 and the predicted NT map 1115 based on the calculated TH2525s. The correlation plot shows an R-squared value of around 0.788.

Figure 12A:
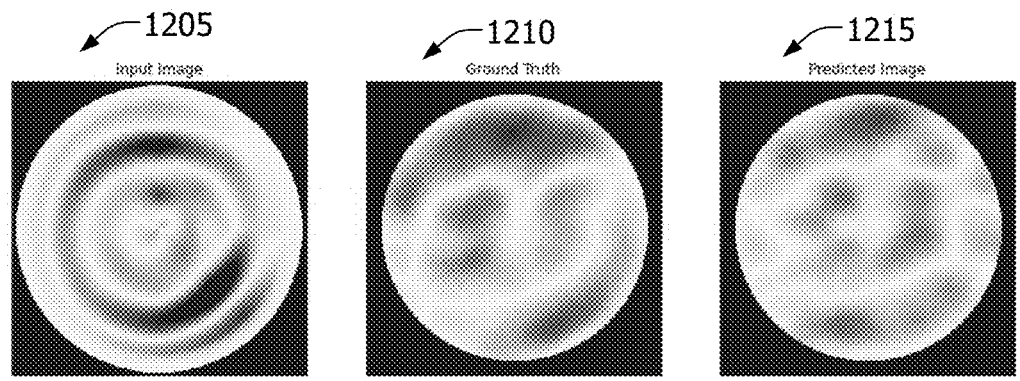
FIG. 12A illustrates images of wafer shape maps.

FIG. 12A illustrates images of wafer shape maps. The first image is an input image 1205, specifically a filtered post-grinding data set map. The second image is a ground truth image 1210, which is an actual post-polishing measured wafer. The ground truth image 1210 may be measured by the nanotopography measurement device 145 (shown in FIG. 1). The third image is a predicted NT map 1215.

Figure 12B:
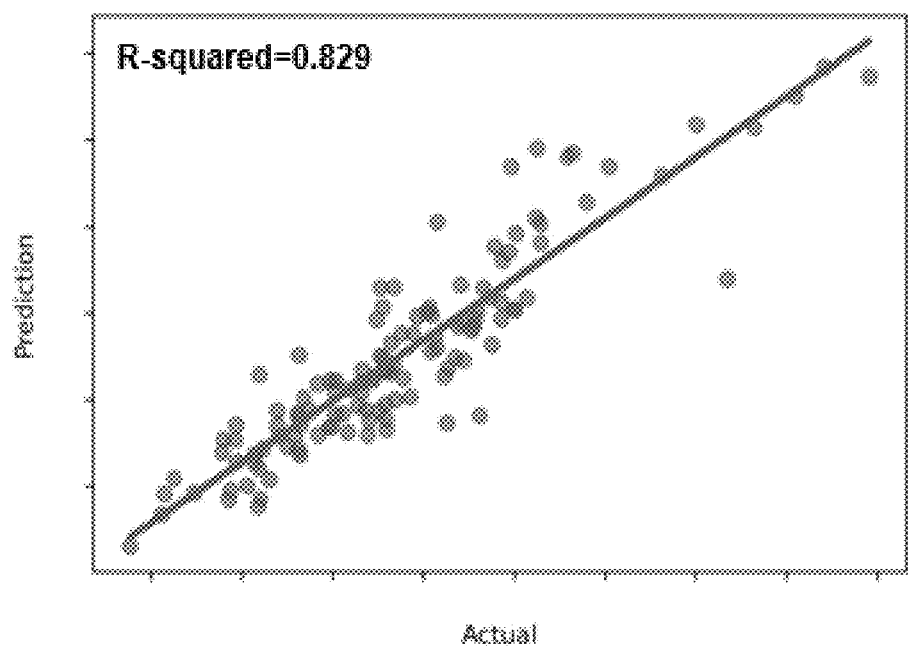
FIG. 12B illustrates an example graph comparing the ground truth image to the predicted NT map shown in FIG. 12A.

FIG. 12B illustrates an example graph comparing the ground truth image 1210 to the predicted NT map 1215 (both shown in FIG. 12A). In this example, the TH2525 is calculated for both the ground truth image 1210 and the predicted NT map 1215. The graph in FIG. 12B illustrates the correlation between the ground truth image 1210 and the predicted NT map 1215 based on the calculated TH2525s. The correlation plot shows an R-squared value of around 0.829.

Figure 13A:
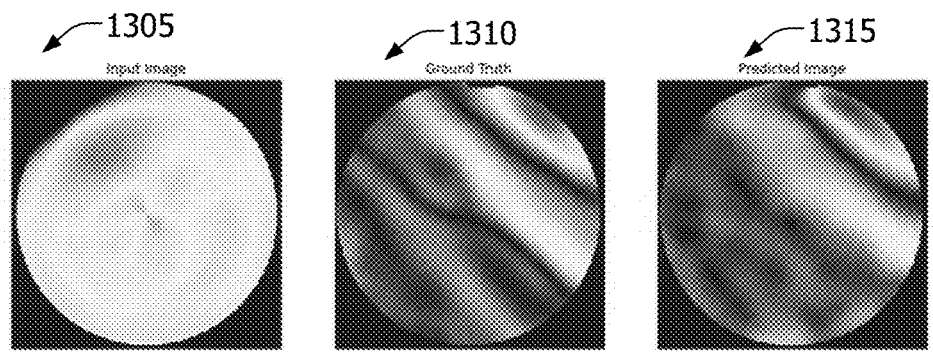
FIG. 13A illustrates images of wafer shape maps.

FIG. 13A illustrates images of wafer shape maps. The first image is an input image 1305, specifically a GAPI RMS map. The second image is a ground truth image 1310, which is an actual post-polishing measured wafer. The ground truth image 1210 may be measured by the nanotopography measurement device 145 (shown in FIG. 1). The third image is a predicted IPD map 1315.

Figure 13B:
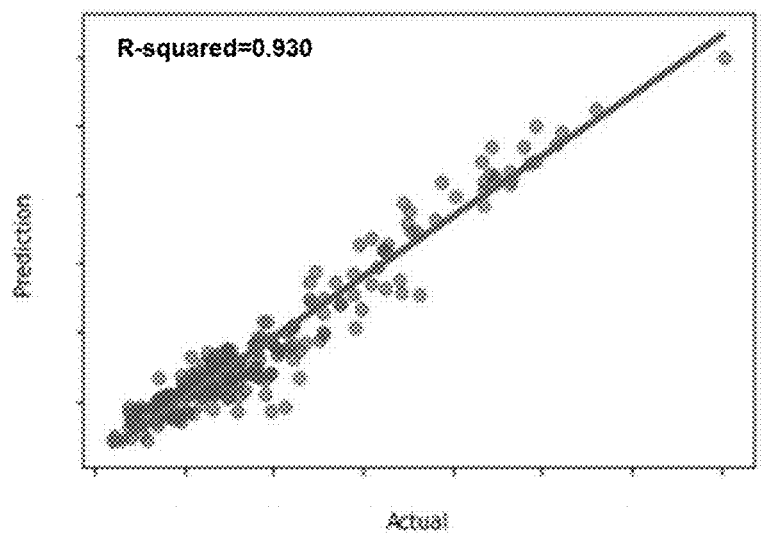
FIG. 13B illustrates an example graph comparing the ground truth image to the predicted IPD map shown in FIG. 13A.

FIG. 13B illustrates an example graph comparing the ground truth image 1210 to the predicted IPD map 1315 (both shown in FIG. 13A). In this example, the TH2525 is calculated for both the ground truth image 1310 and the predicted IPD map 1315. The graph in FIG. 13B illustrates the correlation between the ground truth image 1310 and the predicted IPD map 1315 based on the calculated IPDs. The correlation plot shows an R-squared value of around 0.930.

A computer device, such as the wafer surface analysis computer device 115 (shown in FIG. 1), comprises at least one processor 505 in communication with at least one memory device 510 (both shown in FIG. 50. The WSA computer device 115 is programmed to store, in the at least one memory device 510, a model for converting shape maps to simulate a portion of an assembly line 100 (shown in FIG. 1). The WSA computer device 115 receives scan data of a first inspection of a product being assembled. The first inspection is conducted at a first inspection station (also known as a first measurement device 110, which may be the first measurement device 110 or the second measurement device 125 (both shown in FIG. 1). The first inspection station is in the assembly line 100 subsequent to a first device 105 or 120 (both shown in FIG. 1) in the assembly line 100.

The WSA computer device 115 also generates a shape map from the scan data of the first inspection and executes the model using the shape map as an input to generate a final shape map of the product. The WSA computer device 115 compares the final shape map to one or more thresholds and determines if the final shape map exceeds at least one of the one or more thresholds. If the determination is that the final shape map exceeds at least one of the one or more thresholds, the WSA computer device 115 causes the first device to be adjusted.

The WSA computer device 115 may also calculate one or more product attributes from the final shape map. The WSA computer device 115 compares the one or more product attributes to the one or more thresholds. If the one or more product attributes exceed the one or more thresholds, the WSA computer device 115 causes the first device to be adjusted.

The shape map is suitably one of a post-grinding shape map and a GAPI RMS (root mean square) map. Then the final shape map is one of a post-polishing nanotopography map and an in-plane distortion (IPD) map, respectively. The model is a generative adversarial network (GAN) artificial intelligence model trained with historical images of partially processed and fully processed products. The model converts an input shape map into a simulation of the shape map for a final version of the product.

The shape map is a first shape map, and the final shape map is a first final shape map. In these embodiments, the WSA computer device 115 generates a second shape map from the scan data. The second shape map is generated via a different method than the first shape map. The WSA computer device 115 executes the model using the second shape map as an input to generate a second final shape map of the product. The WSA computer device 115 calculates one or more product attributes from the first final shape map and the second final shape map. The WSA computer device 115 compares the one or more product attributes to the one or more thresholds. If the one or more product attributes exceed the one or more thresholds, the WSA computer device 115 causes the first device to be adjusted. In these embodiments, the first shape map is a post-grinding shape map, the first final shape map is a post-polishing nanotopography map, the second shape map is a GAPI RMS (root mean square) map, and the second final shape map is an in-plane distortion (IPD) map.

The scan data is one of four line scan data or eight line scan data of the product. The product is a semiconductor wafer as described above, and the first device is one of a grinder or a slicer. The first inspection station includes a nanotopography measurement device.

The WSA computer device 115 generates one or more adjustments to first device based on the comparison of the final shape map to the one or more thresholds and the model. The WSA computer device 115 transmits the one or more adjustments to at least one of a user and the first device.

If the determination is made that the final shape map exceeds at least one of the one or more thresholds, the WSA computer device 115 analyzes a plurality of prior inspections to determine a trend. Then the WSA computer device 115 predicts if a subsequent inspection of a subsequent product may exceed at least one of the one or more thresholds based on the trend. Additionally, the WSA computer device 115 adjusts the first device based on the trend.

At least one of the technical solutions enabled by this system to address technical problems may include: (i) improved analysis of wafer surfaces; (ii) decreased loss of material due to malfunction or improper alignment; (iii) increased speed in wafer analysis; (iv) increased accuracy in wafer analysis; (v) reduced unnecessary adjustments to the grinder; (vi) reduced false positives and false negatives; and (vii) updated analysis calibrated for each individual production line.

The computer-implemented methods may include additional, less, or alternate actions, including those discussed elsewhere herein. The methods may be implemented via one or more local or remote processors, transceivers, servers, and/or sensors (such as processors, transceivers, servers, and/or sensors mounted on vehicles or mobile devices, or associated with smart infrastructure or remote servers), and/or via computer-executable instructions stored on non-transitory computer-readable media or medium.

Additionally, the computer systems may include additional, less, or alternate functionality, including that discussed elsewhere herein. The computer systems may include or be implemented via computer-executable instructions stored on non-transitory computer-readable media or medium.

A processor or a processing element may be trained using supervised or unsupervised machine learning, and the machine learning program may employ a neural network, which may be a convolutional neural network, a deep learning neural network, a reinforced or reinforcement learning module or program, or a combined learning module or program that learns in two or more fields or areas of interest. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as images, object statistics and information, historical estimates, and/or actual repair costs. The machine learning programs may utilize deep learning algorithms that may be primarily focused on pattern recognition, and may be trained after processing multiple examples. The machine learning programs may include Bayesian Program Learning (BPL), voice recognition and synthesis, image or object recognition, optical character recognition, and/or natural language processing—either individually or in combination. The machine learning programs may also include natural language processing, semantic analysis, automatic reasoning, and/or machine learning.

Supervised and unsupervised machine learning techniques may be used. In supervised machine learning, a processing element may include example inputs and their associated outputs, and may seek to discover a general rule that maps inputs to outputs, so that when subsequent novel inputs are provided the processing element may, based upon the discovered rule, accurately predict the correct output. In unsupervised machine learning, the processing element may be required to find its own structure in unlabeled example inputs. In one embodiment, machine learning techniques may be used to extract data about wafer surface nanotopography to predict future states.

Based upon these analyses, the processing element may learn how to identify characteristics and patterns that may then be applied to analyzing image data, model data, and/or other data. For example, the processing element may learn, to identify trends that precede a grinder coming out of alignment based upon comparisons of post grinding and post polishing measurements. The processing element may also learn how to identify trends that may not be readily apparent based upon collected scan data, such as trends that precede a grinder coming out of alignment.

The methods and systems may be implemented using computer programming or engineering techniques including computer software, firmware, hardware, or any combination or subset. As disclosed above, at least one technical problem with prior systems is that there is a need for systems for a cost-effective and reliable manner for analyzing data to predict nanotopography. The system and methods described herein address that technical problem. Additionally, at least one of the technical solutions enabled by this system to overcome technical problems may include: (i) improved analysis of wafer surfaces; (ii) decreased loss of material due to malfunction or improper alignment; (iii) increased speed in wafer analysis; (iv) increased accuracy in wafer analysis; and (v) updated analysis calibrated for each individual production line.

The methods and systems described may be implemented using computer programming or engineering techniques including computer software, firmware, hardware, or any combination or subset thereof, wherein the technical effects may be achieved by performing at least one of the following steps: (a) store, in the at least one memory device, a model for simulating a portion of an assembly line; b) receive scan data of a first inspection of a product being assembled, wherein the first inspection is positioned at a first inspection station in the assembly line subsequent to a first device in the assembly line; c) execute the model using the scan data as inputs to generate a final profile of the product; d) compare the final profile to one or more thresholds; e) determine if the final profile exceeds at least one of the one or more thresholds; f) if the determination is that the final profile exceeds at least one of the one or more thresholds, cause the first device to be adjusted; g) generate the model for simulating a portion of an assembly line based on a plurality of inspection data of that assembly line, wherein the assembly line includes a second inspection station subsequent to a second device of the assembly line, and wherein the model generates the final profile of the product, which simulates an actual profile of the product upon reaching the second inspection station, wherein the second inspection station is positioned subsequent to completion of the assembly line, wherein the plurality of inspection data includes a first plurality of scan data of a plurality of individual products at the first inspection station and a second plurality of scan data of the plurality of individual products at the second inspection station; h) receive scan data of a second inspection of a product being assembled at the second inspection station; i) compare the scan data of the second inspection to the final profile; j) adjust the model based on the comparison; k) generate one or more adjustments to first device based on the comparison of the final profile to one or more thresholds and the model; l) transmit the one or more adjustments to at least one of a user and the first device; and m) if the determination is that the final profile exceeds at least one of the one or more thresholds, at least one of the following steps is performed: i) analyze a plurality of prior inspections to determine a trend; ii) predict if a subsequent inspection of a subsequent product may exceed at least one of the one or more thresholds based on the trend; and iii) adjust the first device based on the trend.

The methods may be implemented via one or more local or remote processors, transceivers, servers, and/or sensors (such as processors, transceivers, servers, and/or sensors mounted on vehicles or mobile devices, or associated with smart infrastructure or remote servers), and/or via computer-executable instructions stored on non-transitory computer-readable media or medium. Additionally, the computer systems discussed herein may include additional, less, or alternate functionality, including that discussed elsewhere herein. The computer systems discussed herein may include or be implemented via computer-executable instructions stored on non-transitory computer-readable media or medium.

As used herein, the term "non-transitory computer-readable media" is intended to be representative of any tangible computer-based device implemented in any method or technology for short-term and long-term storage of information, such as, computer-readable instructions, data structures, program modules and sub-modules, or other data in any device. Therefore, the methods described herein may be encoded as executable instructions embodied in a tangible, non-transitory, computer readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including, without limitation, volatile and nonvolatile media, and removable and non-removable media such as a firmware, physical and virtual storage, CD-ROMs, DVDs, and any other digital source such as a network or the Internet, as well as yet to be developed digital means, with the sole exception being a transitory, propagating signal.

This written description uses examples to disclose various implementations, including the best mode, and also to enable any person skilled in the art to practice the various implementations, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

When introducing elements of the present disclosure or the embodiment(s) thereof, the articles "a", "an", "the" and "said" are intended to mean that there are one or more of the elements. The terms "comprising," "including," "containing" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the disclosure, it is intended that all matter contained in the above description and shown in the accompanying drawing(s) shall be interpreted as illustrative and not in a limiting sense.

What is claimed is:

1. A computer device comprising at least one processor in communication with at least one memory device, wherein the at least one processor is programmed to:
   store, in the at least one memory device, a model for converting shape maps to simulate a portion of an assembly line, wherein the model is a generative adversarial network (GAN) artificial intelligence model;
   receive scan data of a first inspection of a product being assembled, wherein the first inspection is conducted at a first inspection station in the assembly line subsequent to a first device in the assembly line, wherein the first device is a grinder;
   generate a shape map from the scan data of the first inspection;
   execute the model using the shape map as an input to generate a final shape map of the product;
   compare the final shape map to one or more thresholds;
   determine if the final shape map exceeds at least one of the one or more thresholds; and
   if the determination is made that the final shape map exceeds at least one of the one or more thresholds, cause the grinder to be adjusted.

2. The computer device of claim 1, wherein the at least one processor is further programmed to:
   calculate one or more product attributes from the final shape map;
   compare the one or more product attributes to the one or more thresholds; and
   if the one or more product attributes exceed the one or more thresholds, cause the first device to be adjusted.

3. The computer device of claim 1, wherein the shape map is a post-grinding shape map and wherein the final shape map is a post-polishing nanotopography map.

4. The computer device of claim 1, wherein the shape map is a GAPI RMS (root mean square) map, and wherein the final shape map is an in-plane distortion (IPD) map.

5. The computer device of claim 1, wherein the model converts an input shape map to a simulation of the shape map for a final version of the product.

6. The computer device of claim 1, wherein the shape map is a first shape map, wherein the final shape map is a first final shape map, and wherein the at least one processor is further programmed to:
   generate a second shape map from the scan data, wherein the second shape map is generated via a different method than the first shape map; and
   execute the model using the second shape map as an input to generate a second final shape map of the product.

7. The computer device of claim 6, wherein the at least one processor is further programmed to:
   calculate one or more product attributes from the first final shape map and the second final shape map;
   compare the one or more product attributes to the one or more thresholds; and
   if the one or more product attributes exceed the one or more thresholds, cause the first device to be adjusted.

8. The computer device of claim 6, wherein the first shape map is a post-grinding shape map, wherein the first final shape map is a post-polishing nanotopography map, wherein the second shape map is a GAPI RMS (root mean square) map, and wherein the second final shape map is an in-plane distortion (IPD) map.

9. The computer device of claim 1, wherein the scan data is one of four line scan data or eight line scan data of the product.

10. The computer device of claim 1, wherein the product is a semiconductor wafer.

11. The computer device of claim 10, wherein the first device is one of a grinder or a slicer and wherein the first inspection station includes a nanotopography measurement device.

12. The computer device of claim 1, wherein the at least one processor is further programmed to:
   generate one or more adjustments to first device based on the comparison of the final shape map to the one or more thresholds and the model; and
   transmit the one or more adjustments to at least one of a user and the first device.

13. The computer device of claim 1, wherein if the determination is made that the final shape map exceeds at least one of the one or more thresholds, the at least one processor is further programmed to:
   analyze a plurality of prior inspections to determine a trend;
   predict if a subsequent inspection of a subsequent product may exceed at least one of the one or more thresholds based on the trend; and
   adjust the first device based on the trend.

14. The computer device of claim 13, the at least one processor is further programmed to:
   determine a planned future period of downtime; and
   schedule an adjustment the first device for the planned future period of downtime.

15. A method for analyzing an assembly line, the method implemented by a computing device including at least one processor in communication with at least one memory device, the method comprising:
   storing, in the at least one memory device, a model for simulating a portion of an assembly line, wherein the model is a generative adversarial network (GAN) artificial intelligence model;
   storing, in the at least one memory device, a model for converting shape maps to simulate a portion of an assembly line;
   receiving scan data of a first inspection of a product being assembled, wherein the first inspection is conducted at a first inspection station in the assembly line subsequent to a first device in the assembly line, wherein the first device is a grinder;
   generating a shape map from the scan data of the first inspection;
   executing the model using the shape map as an input to generate a final shape map of the product;
   comparing the final shape map to one or more thresholds;
   determining if the final shape map exceeds at least one of the one or more thresholds; and
   if the determination is made that the final shape map exceeds at least one of the one or more thresholds, causing the grinder to be adjusted.

16. The method of claim 15 further comprising:
   calculating one or more product attributes from the final shape map;
   comparing the one or more product attributes to the one or more thresholds; and
   if the one or more product attributes exceed the one or more thresholds, causing the first device to be adjusted.

17. The method of claim 15, wherein the shape map is one of a post-grinding shape map or a GAPI RMS (root mean square) map, and wherein the final shape map is one of a post-polishing nanotopography map of an in-plane distortion (IPD) map.

18. The method of claim 15, wherein the shape map is a first shape map, wherein the final shape map is a first final shape map, and wherein the method further comprises:
generating a second shape map from the scan data, wherein the second shape map is generated via a different method than the first shape map; and
executing the model using the second shape map as an input to generate a second final shape map of the product.

19. The method of claim 18 further comprising:
calculating one or more product attributes from the first final shape map and the second final shape map;
comparing the one or more product attributes to the one or more thresholds; and
if the one or more product attributes exceed the one or more thresholds, causing the first device to be adjusted.

20. The method of claim 18, wherein the first shape map is a post-grinding shape map, wherein the first final shape map is a post-polishing nanotopography map, wherein the second shape map is a GAPI RMS (root mean square) map, and wherein the second final shape map is an in-plane distortion (IPD) map.

* * * * *